April 28, 1964 P. O. SNYDER ETAL 3,131,318
TIME CONTROLLED POWER CIRCUIT
Filed Oct. 3, 1962
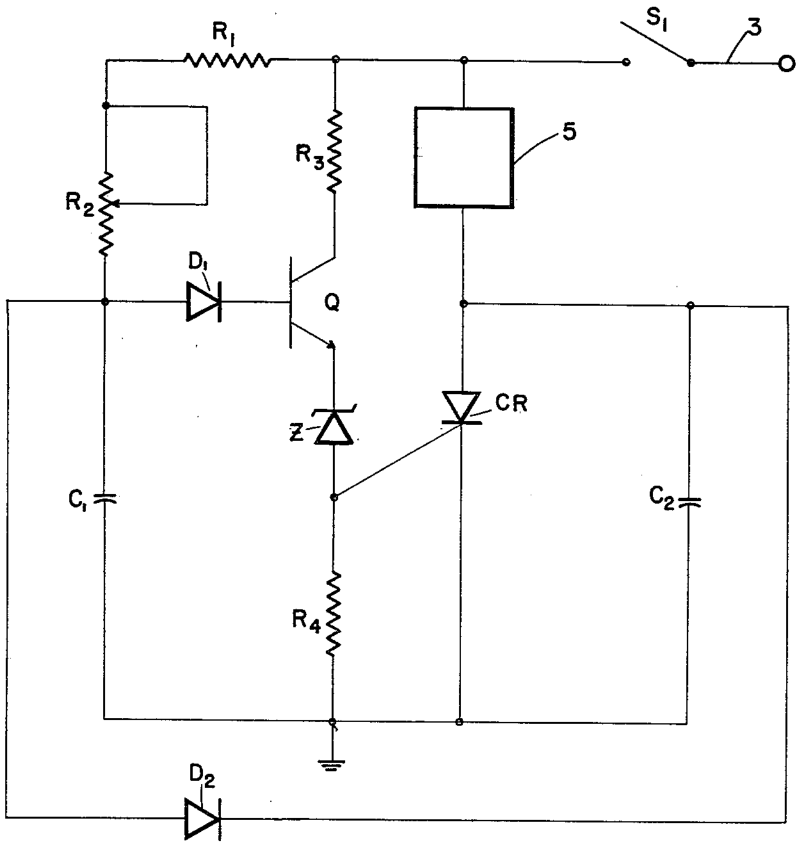
INVENTORS
PAUL O. SNYDER
BY EDMUND T. BRIDGE
Arthur W. Collins
ATTORNEY 3,131,318
Patented Apr. 28, 1964

3,131,318

TIME CONTROLLED POWER CIRCUIT

Paul O. Snyder, Linthicum Heights, and Edmund T. Bridge, Glen Burnie, Md., assignors, by mesne assignments, to the United States of America as represented by the Secretary of the Navy Filed Oct. 3, 1962, Ser. No. 228,206
1 Claim. (Cl. 307—88.5)

The present invention relates to a novel and improved electronic timing circuit and more particularly to a novel and improved compact timing circuit which provides a high degree of accuracy in measuring time intervals of relatively long duration and which is capable of switching relatively large amounts of power upon expiration of the predetermined time interval.

Various electrical and electronic applications often require an accurate measurement or use of a preset time delay or interval. Although numerous timing circuits have been devised and employed in the past, considerable difficulty has been experienced heretofore in providing a time circuit which effects the required time delay with facility and certainty in the accuracy of results without the use of involved bulky apparatus.

It is, therefore, a principal object of the present invention to provide a unique timer circuit which is compact, relatively simple in design and highly accurate in measuring relatively prolonged time intervals.

It is a further object of the present invention to provide a novel and improved transistorized timing circuit which utilizes the unique characteristic of a silicon control rectifier.

Other objects and many of the attendant advantages of this invention will be readily appreciated as the same becomes better understood by reference to the following detailed description when considered in connection with the accompanying drawing wherein:

The single figure in the drawing is a diagrammatic view of a preferred embodiment of the present invention.

In general, in the improved timer circuit of the present invention, the charging cycle of a conventional resistance-capacitance circuit is interrupted when the potential across the capacitor reaches a predetermined threshold value and gates a silicon control rectifier which is connected in parallel with the condenser. Stable switching of the silicon control rectifier is insured by controlling its gate by a transistor circuit which is itself gated "on" when the threshold potential across the condenser is reached.

As shown more specifically in the drawing, the charging circuit for condenser $C_1$ extends from the positive power supply line 3 through the manually operable switch $S_1$ through fixed resistor $R_1$ and variable resistor $R_2$ and through the condenser $C_1$ to ground. The junction of condenser $C_1$ and variable resistor $R_2$ is coupled to the base of transistor Q through diode $D_1$. The emitter-collector circuit of transistor Q extends from the power supply line 3 successively through switch $S_1$, resistor $R_3$, the transistor Q, the Zener diode Z and resistor $R_4$ to ground. The junction of diode Z and resistor $R_4$ is connected as shown to the gate element of the silicon control rectifier CR. The anode-cathode circuit of the control rectifier CR extends from the power supply line 3 through switch $S_1$, through the load impedance 5 and through the rectifier CR to ground. The junction of variable resistor $R_2$ and condenser $C_1$ is coupled to the junction of the load 5 and the anode of rectifier CR through diode $D_2$. Condenser $C_2$ is coupled as shown between the anode of rectifier CR and ground.

In operation, when the manual switch $S_1$ is closed, condenser $C_1$ begins to charge through resistors $R_1$ and $R_2$. The charging rate of condenser $C_1$ is controlled by adjustment of the variable arm of resistor $R_2$. When the potential at the junction of condenser $C_1$ and resistor $R_2$ and at the base of transistor Q reaches a predetermined point, transistor Q begins to conduct. When this occurs, the voltage developed as a result of the flow of current through resistor $R_4$ fires the control rectifier CR. Current then flows through the load impedance 5 and condenser $C_1$ discharges through the control rectifier CR to ground. Control rectifier CR then remains in its "on" state until either switch $S_1$ is opened or the potential applied to the power supply line 3 is removed at which time rectifier CR will be deenergized and the timing operation may be recycled.

Obviously many modifications and variations of the present invention are possible in the light of the above teachings. It is therefore to be understood that within the scope of the appended claim the invention may be practiced otherwise than as specifically described.

What is claimed is:

Timing circuitry comprising a direct current power source; a variable resistor; a condenser; means connecting the variable resistor and the condenser in series across the power source; a load; a silicon control rectifier; means connecting the load and the control rectifier in series across the source; a pair of resistors; a Zener diode; a transistor having an emitter-collector circuit that extends from one terminal of the source successively through one of the resistors, the transistor, the Zener diode and the other of the resistors to the other terminal of the source; means coupling the junction of the variable resistor and the condenser to the base of the transistor; and means coupling the junction of the variable resistor and the condenser to the junction of the load and the control rectifier.

References Cited in the file of this patent

UNITED STATES PATENTS

| | | |
|---|---|---|
| 3,098,953 | Herr | July 23, 1963 |

OTHER REFERENCES

"Silicon Controlled Rectifier Manual," by General Electric dated Dec. 29, 1961 (2nd Edit.). Pages 106–108 and Fig. 7.15 relied on.

"A Survey of Some Circuit Applicatons of the Silicon Controlled Rectifier Switch and Silicon Controlled Rectifier," by Solid State Products, Inc. Bulletin D420–02 dated September 1960. Pages 15–17 and Figs. 22–26 are pertinent.